United States Patent
Lozhkin (10) Patent No.: US 9,048,796 B2
(45) Date of Patent: Jun. 2, 2015

(54) TRANSMISSION SIGNAL POWER CONTROL APPARATUS, COMMUNICATION APPARATUS AND PREDISTORTION COEFFICIENT UPDATING METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 84 days.

(21) Appl. No.: 14/071,758

(22) Filed: Nov. 5, 2013

(65) Prior Publication Data
US 2014/0191798 A1    Jul. 10, 2014

(30) Foreign Application Priority Data
Jan. 7, 2013 (JP) .................................. 2013-000506

(51) Int. Cl.
 *H04B 1/04* (2006.01)
 *H03F 1/32* (2006.01)

(52) U.S. Cl.
 CPC ............ *H03F 1/3247* (2013.01); *H03F 1/3258* (2013.01)

(58) Field of Classification Search
 CPC .................................................. H03F 1/3247
 USPC .................. 455/114.3, 114.2, 67.11
 See application file for complete search history.

(56) References Cited

U.S. PATENT DOCUMENTS 5,991,308 A * 11/1999 Fuhrmann et al. ........ 370/395.53
6,356,555 B1 * 3/2002 Rakib et al. .................... 370/441
(Continued)

FOREIGN PATENT DOCUMENTS

| JP | 2002-359655 | 12/2002 |
|----|-------------|---------|
| JP | 2003-124752 | 4/2003  |
| JP | 2003-283586 | 10/2003 |

(Continued)

OTHER PUBLICATIONS

Chen, Hsin-Hung et al., "Joint Polynomial and Look-Up-Table Predistortion Power Amplifier Linearization", IEEE Transactions on Circuits and Systems II: Express Briefs, vol. 53, No. 8, Aug. 2006, pp. 612-616.

(Continued)

*Primary Examiner* — Sanh Phu
(74) *Attorney, Agent, or Firm* — Fujitsu Patent Center (57) ABSTRACT

A transmission signal power control apparatus includes a power amplifier model unit which generates a learning digital signal by multiplying part of a predistortion signal by model coefficients which tentatively represent the input-output characteristics of a power amplifier, and an adaptive low-pass filter which generates a pseudo feedback signal by attenuating the high frequency components of the learning digital signal by multiplying the learning digital signal by weighting coefficients. Then, the power amplifier model unit updates the model coefficients such that the error between the feedback signal whose the high frequency components are attenuated by the low-pass filter and which is digitized, and the pseudo feedback signal is minimized, and the adaptive low-pass filter updates the weighting coefficients such that the error is minimized.

8 Claims, 6 Drawing Sheets

(56) References Cited

U.S. PATENT DOCUMENTS

| | | | |
|---|---|---|---|
| 2002/0131523 A1* | 9/2002 | Nagasaka et al. | 375/297 |
| 2003/0031270 A1 | 2/2003 | Giardina et al. | |
| 2005/0210354 A1 | 9/2005 | Kurokami | |
| 2005/0258898 A1 | 11/2005 | Hongo | |
| 2006/0274904 A1* | 12/2006 | Lashkari | 381/59 |

FOREIGN PATENT DOCUMENTS

| | | |
|---|---|---|
| JP | 2005-333353 | 12/2005 |
| JP | 2010-050908 | 3/2010 |

OTHER PUBLICATIONS

Akaiwa, Yoshihiko, "Introduction to Digital Mobile Communication", John Wiley & Sons, Inc., New York (1997).

Ding, Lei et al., "A Robust Digital Baseband Predistorter Constructed Using Memory Polynominals", IEEE Transactions on Communications, vol. 52, No. 1, Jan. 2004, pp. 159-165.

Marsalek, R. et al., "From Post-Distortion to Pre-Distortion for Power Amplifiers Linearization", IEEE Communications Letters, vol. 7, No. 7, Jul. 2003, pp. 308-310.

* cited by examiner

TRANSMISSION SIGNAL POWER CONTROL APPARATUS, COMMUNICATION APPARATUS AND PREDISTORTION COEFFICIENT UPDATING METHOD

CROSS-REFERENCE TO RELATED APPLICATION

This application is based upon and claims the benefit of priority of the prior Japanese Patent Application No. 2013-000506, filed on Jan. 7, 2013, the entire contents of which are incorporated herein by reference.

FIELD

The embodiments discussed herein are related to a transmission signal power control apparatus which amplifies transmission signal power using a power amplifier, a communication apparatus which has such transmission signal power control apparatus, and a predistortion coefficient updating method for updating predistortion coefficients which represents inverse characteristics of the input-output characteristics of a power amplifier.

BACKGROUND

In a radio communication system, it is preferable that the communication devices to be used in the system are small and the amount of energy consumption of the communication devices is low. Regarding this point, since a power amplifier which is provided in a communication device and which is used to amplify transmission signal power consumes a large amount of power, it is effective to improve the energy efficiency of the power amplifier. A power amplifier is generally used in an area where the energy efficiency with respect to the input transmission signal power is high. As power amplifiers of high energy efficiency, for example, a Doherty amplifier, an envelope elimination and restoration (EER) filter and/or the like are used. However, such power amplifiers may have input-output characteristics in which the relationship between the input power and the output power is distorted non-linearly. Then, when a power amplifier is used in an area where the input-output characteristics are non-linear, the waveform of a transmission signal that is output from the power amplifier may be deteriorated, and, as a result, unwanted high frequency components are produced in the transmission signal, and signal power may leak between neighboring channels.

Consequently, predistortion-type compensation techniques for compensating for the non-linear distortion by a power amplifier by obtaining inverse characteristics of the input-output characteristics which the power amplifier has, applying distortion in response to the inverse characteristics to a transmission signal and inputting the predistorted transmission signal to the power amplifier, have been proposed (for example, see Japanese Laid-Open Patent Publication No. 2005-333353, Japanese Laid-Open Patent Publication No. 2003-124752, Japanese Laid-Open Patent Publication No. 2010-50908, Hsin-Hung Chen, Chih-Hung Lin, Po-Chiun Huang, and Jiunn-Tsair Chen, "Joint Polynomial and Look-Up-Table Predistortion Power Amplifier Linearization," IEEE Transactions On Circuits And Systems-II: EXPRESS BRIEFS, VOL. 53, NO. 8, August 2006, Y. Akaiwa, "Introduction to Digital Mobile Communication," Wiley, New York (1997), Lei Ding et al., "A Robust Digital Baseband Predistorter Constructed Using Memory Polynomials," IEEE Transaction On Communications, Vol. 52, No. 1, January 2004 and R. Marsalek, P. Jardin, and G. Baudoin, "From Post-Distortion to Pre-Distortion for Power Amplifier Linearization, "IEEE Communications Letters, VOL. 7, NO. 7, July 2003).

In the predistortion-type compensation techniques, part of a signal that is output from a power amplifier is fed back, and predistortion coefficients are updated such that the error between the output signal and a transmission signal, the distortion of which is compensated for using the predistortion coefficients, is minimized.

The signal that is output from the power amplifier is an analog signal, but the output signal that is fed back to learn the predistortion coefficients is converted to a digital signal by an analog-to-digital converter (hereinafter simply referred to as "A/D converter"). However, since an A/D converter samples an output signal with a specific sampling pitch, when the sampling frequency of the A/D converter is less than twice the maximum frequency of the output signal, aliasing is produced in the digitized output signal, and, as a result, out-of-band frequency components, which are frequency components not originally included in the output signal, are produced. In base a station that complies with Long Term Evolution (LTE), an output signal that is fed back may have a 500 MHz band. In such cases, to prevent aliasing from being produced, it is preferable to use a high-speed A/D converter having a sampling frequency of at least 1 GHz, preferably 2 GHz. However, such high-speed A/D converters are generally expensive.

To reduce the cost of A/D converters, study is in progress to alleviate the requirement of the sampling frequency of A/D converters by limiting the band of the feedback signal to be used to learn the predistortion coefficients. However, when an output signal that is fed back is input to an A/D converter having a comparatively low sampling frequency, out-of-band frequency components due to aliasing increase. Consequently, reducing the out-of-band frequency components by inputting an output signal that is fed back to an A/D converter after the output signal passes an anti-aliasing low-pass filter, has been proposed.

SUMMARY

However, an output signal having passed a low-pass filter deteriorates also due to the frequency characteristics of the low-pass filter. As a result of this, the predistortion coefficients may not be optimized.

According to one embodiment, a transmission signal power control apparatus is provided. The transmission signal power control apparatus includes: a power amplifier which amplifies a transmission signal; a first low-pass filter which attenuates a frequency component of a feedback signal, which is higher than a certain sampling frequency, the feedback signal being part of a signal that is output from the power amplifier; an analog-to-digital converter which digitizes the feedback signal output from the first low-pass filter by the certain sampling frequency; a predistortion unit which generates a predistortion signal to input to the power amplifier, by multiplying the transmission signal by predistortion coefficients which represent an inverse characteristic of an input-output characteristic of the power amplifier; a power amplifier model unit which generates a learning digital signal by multiplying part of the predistortion signal by model coefficients which tentatively represent the input-output characteristic of the power amplifier; an inverse unit which calculates the predistortion coefficients from the model coefficients; a second low-pass filter which generates a pseudo feedback signal by attenuating a high frequency component of the learning digital signal by multiplying the learning digital signal by weighting coefficients; and a subtractor which calculates an error between the pseudo feedback signal and the digitized feedback signal. Then, the power amplifier model unit updates the model coefficients such that the error is minimized, and the second low-pass filter is an adaptive filter which updates the weighting coefficients such that the error is minimized.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A transmission signal power control apparatus according to one embodiment will be explained below with reference to the accompanying drawings.

The transmission signal power control apparatus generates, as a learning digital signal, a signal given by correcting part of a predistortion signal, which is generated by applying non-linear distortion of the inverted input-output characteristics of a power amplifier, in response to the tentatively reproduced input-output characteristics of the power amplifier. The transmission signal power control apparatus compares the learning digital signal and an output signal that is fed back after the learning digital signal and the output signal pass a low-pass filter to attenuate the high frequency components. Then, the transmission signal power control apparatus updates the predistortion coefficients such that the error between the learning digital signal and the output signal that is fed back, in which the high frequency components are attenuated, is minimized.

The output signal that is fed back is an analog signal, and, after passing the low-pass filter for the analog signal, is digitized by an A/D converter. On the other hand, the learning digital signal is a digital signal, and the low-pass filter for the learning digital signal is also a digital filter. Consequently, the transmission signal power control apparatus uses an adaptive-type filter as the low-pass filter for the learning digital signal, and compensates for the variation of input-output characteristics of the analog low-pass filter for the output signal due to the individual variability of the analog low-pass filter. In other words, the transmission signal power control apparatus minimizes the differences in input-output characteristics between the digital low-pass filter for the learning digital signal and the analog low-pass filter for the output signal that is fed back, in order to optimize the predistortion coefficients.

The transmission signal power control apparatus may be mounted in various communication apparatuses that amplify a transmission signal using a power amplifier and output the amplified transmission signal. For example, the transmission signal power control apparatus may be mounted on a base station or a mobile station in a mobile communication system in compliance with a predetermined communication standard. The predetermined communication standard is, for example, LTE, or mobile WiMAX (Mobile Worldwide Interoperability for Microwave Access).

Figure 1:
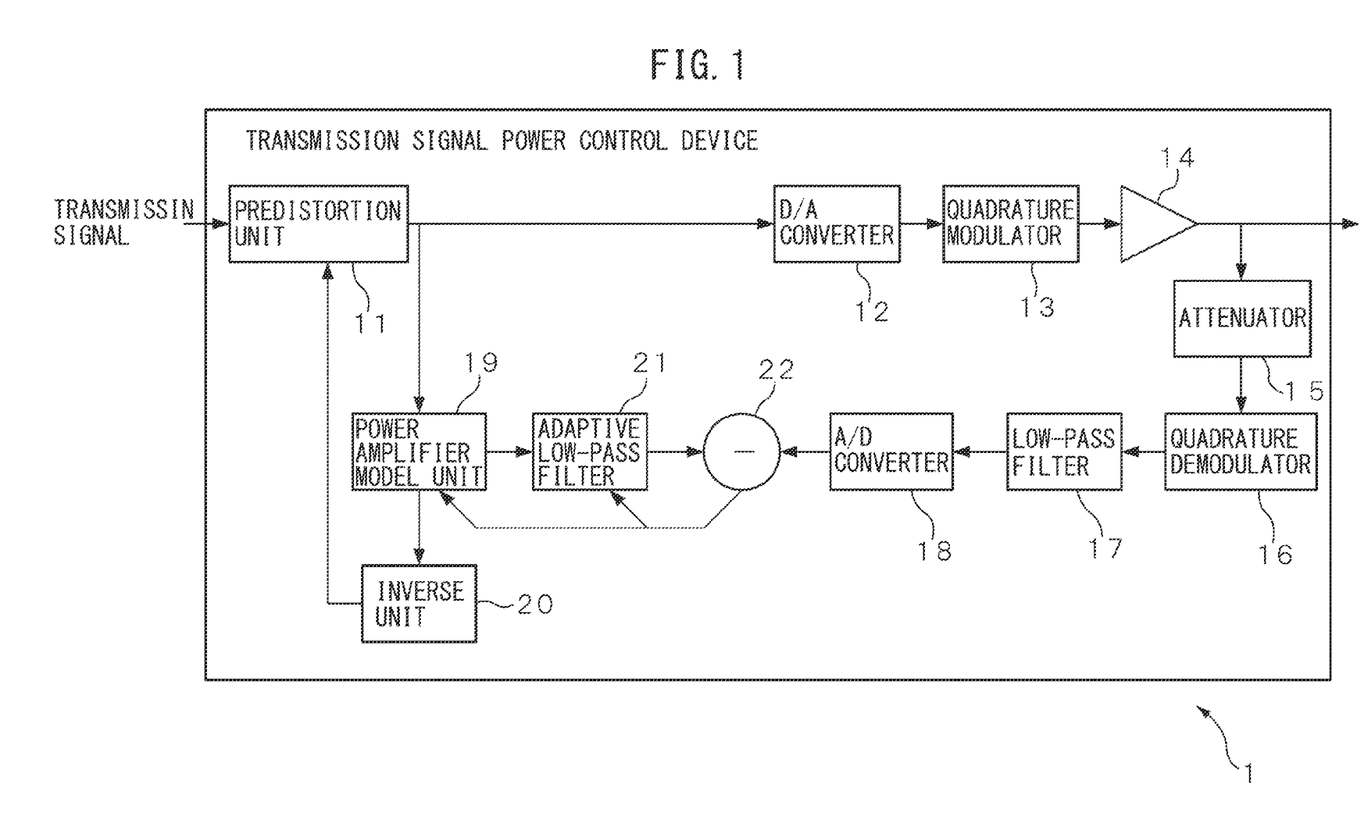
FIG. 1 is a schematic configuration diagram of a transmission signal power control apparatus according to one embodiment.

FIG. 1 is a schematic configuration diagram of a transmission signal power control apparatus according to one embodiment. The transmission signal power control apparatus 1 includes a predistortion unit 11, a digital-to-analog converter 12, a quadrature modulator 13, a power amplifier 14, an attenuator 15, a quadrature demodulator 16, a low-pass filter 17, an analog-to-digital converter 18, an amplifier model unit 19, an inverse unit 20, an adaptive low-pass filter 21, and a subtractor 22.

The units included in the transmission signal power control apparatus 1 may be implemented as a separate circuit in the transmission signal power control apparatus 1. Alternatively, some of the units included in the transmission signal power control apparatus 1 may be implemented as one integrated circuit in the transmission signal power control apparatus 1. For example, the predistortion unit 11, the amplifier model unit 19, the inverse unit 20, the adaptive low-pass filter 21 and the subtractor 22, which are the circuits to process digital signals, may be implemented as one digital signal processor.

The predistortion unit 11 generates a predistortion signal by applying inverse characteristics of the input-output characteristics of the power amplifier 14 to a transmission signal according to a memory polynomial scheme.

The transmission signal is a digital signal that is multiplexed by a predetermined multiplexing scheme and modulated by a predetermined modulation scheme, and, for example, the predistortion unit 11 receives the transmission signal from a baseband processing unit (not illustrated). Further, the transmission signal includes, for example, an I-signal component and a Q-signal component which has a phase that is orthogonal to the I-signal component.

The predistortion unit 11 includes, for example, a multiplier, a delay circuit, and a rewritable memory circuit, and stores a plurality of predistortion coefficients that represent inverse characteristics of the input-output characteristics of the power amplifier 14 according to a memory polynomial, in the memory circuit. The predistortion coefficients are updated from time to time by the amplifier model unit 19, the inverse unit 20 and the adaptive low-pass filter 21, as will be described later.

The predistortion unit 11 applies predistortion to the transmission signal by multiplying the transmission signal by the predistortion coefficients that are read from the memory circuit, according to the following equation:

$$z(n) = \sum_{k=1}^{K} \sum_{q=0}^{Q} a_{kq} \cdot x(n-q) \cdot |x(n-q)|^{k-1} \quad (1)$$

where $a_{kq}$ (k=1, ... K, q=1, Q) is the predistortion coefficients represented by a complex number. Furthermore, x(n) is the transmission signal at discrete time n. Then, z(n) is a predistortion signal.

The predistortion unit 11 outputs the predistortion signal to the digital-to-analog converter 12. In addition, the predistortion unit 11 outputs part of the predistortion signal to the amplifier model unit 19.

The digital-to-analog converter 12 converts the predistortion signal received from the predistortion unit 11 to an analog signal, in order to input to the power amplifier 14. Then, the digital-to-analog converter 12 output the analog predistortion signal to the quadrature modulator 13.

The quadrature modulator 13 includes an oscillator that oscillates a local oscillation signal, which is a periodic signal having a local oscillation frequency, and a multiplier. Then, the quadrature modulator 13 combines the signal that is acquired by multiplying the I-signal component of the analog predistortion signal, by a local oscillation signal having a phase that is shifted by $\pi/2$, and the signal that is acquired by multiplying the Q-signal component by the local oscillation signal. By this means, the quadrature modulator 13 superimposes the analog predistortion signal over a carrier wave. Then, the quadrature modulator 13 outputs the analog predistortion signal that is superimposed on the carrier wave, to the power amplifier 14.

The power amplifier 14 amplifies the analog predistortion signal superimposed on the carrier wave. Consequently, the power amplifier 14 may be a high-efficiency non-linear amplifier having input-output characteristics in which the relationship of output power with respect to input power becomes non-linear, and may be, for example, a Doherty amplifier or an EER amplifier. The non-linear distortion of the input-output characteristics of the power amplifier 14 is compensated by predistortion, so that the signal to be output from the power amplifier 14 is a signal that is obtained by amplifying the transmission signal by a certain gain G. In other words, as the power of the transmission signal increases, the power of the output signal from the power amplifier 14 also increases linearly by the gain G. The output signal from the power amplifier 14 is transmitted via, for example, a duplexer (not illustrated), to an antenna (not illustrated), and then the output signal is emitted from the antenna as a radio signal.

Further, part of the output signal from the power amplifier 14 is fed back in order to update the predistortion coefficients and is input in the attenuator 15. Note that, hereinafter, part of an output signal that is fed back from the power amplifier 14 will be referred as "feedback signal" for ease of explanation.

The attenuator 15 attenuates the feedback signal received from the power amplifier 14 by the gain G of the power amplifier 14. In other words, the attenuator 15 reduces the power value of the feedback signal by 1/G. The attenuated feedback signal, output from the attenuator 15, is input in the quadrature demodulator 16.

The quadrature demodulator 16 includes an oscillator which oscillates a local oscillation signal and a multiplier. Then, the quadrature demodulator 16 converts the feedback signal into a signal having a baseband frequency by mixing the attenuated feedback signal and the local oscillation signal, and separates the I-signal component and the Q-signal component. Then, the quadrature demodulator 16 outputs the feedback signal having baseband frequency to the low-pass filter 17.

The low-pass filter 17 attenuates, with respect to the feedback signal having a baseband frequency, the components of higher frequencies than the sampling frequency of the analog-to-digital converter 18. Then, the low-pass filter 17 outputs the feedback signal whose the high frequency components are attenuated, to the analog-to-digital converter 18.

The analog-to-digital converter 18 digitizes the feedback signal whose the high frequency components are attenuated, by sampling the feedback signal with a certain sampling frequency. Since the high frequency components of the feedback signal have been attenuated, the sampling frequency can be a frequency that is lower than twice the original bandwidth of the feedback signal. Then, the analog-to-digital converter 18 outputs the digitized feedback signal to the subtractor 22.

The amplifier model unit 19 includes, for example, a multiplier, a delay circuit, and a rewritable memory circuit, and generates a learning digital signal by compensating for a predistortion signal by a polynomial which tentatively represents the input-output characteristics of the power amplifier 14. The learning digital signal is a signal which tentatively represents an output signal from the power amplifier 14. Note that the polynomial to represent the input-output characteristics of the power amplifier 14 tentatively is represented by, for example, the following equation:

$$y'(n) = \Sigma_{k=1}^{K} \Sigma_{q=0}^{Q} P_{kq} \cdot z(n-q) \cdot |z(n-q)|^{k-1} \quad (2)$$

where $p_{kq}$ (k=1, ... K, q=1, Q) are the power amplifier model coefficients, represented by a complex number, and is stored in the memory circuit. Furthermore, y'(n) is the learning digital signal at discrete time n.

The amplifier model unit 19 updates the power amplifier model coefficients $P_{kq}(n)$ based on an error signal $\epsilon(n)$ acquired from the subtractor 22. The error signal represents the difference between a pseudo feedback signal that is acquired by inputting the learning digital signal to the adaptive low-pass filter 21 and the digitized feedback signal whose the high frequency components are attenuated by the low-pass filter 17.

With the present embodiment, the amplifier model unit 19 updates the power amplifier model coefficients $P_{kq}(n)$ from time to time such that the square sum of the error signal $\epsilon(n)$ is minimized, by the following equation in accordance with an algorithm of the least mean square method.

$$P_{kq}(n) = P_{kq}(n-1) + \alpha \cdot z(n) \cdot \epsilon(n) \quad (3)$$

where $\alpha$ is the step size parameter, and determines the update rate of the power amplifier model coefficients $P_{kq}(n)$. As $\alpha$ is greater, the update rate of the power amplifier model coefficients $P_{kq}(n)$ becomes faster.

The amplifier model unit 19 outputs the learning digital signal to the adaptive low-pass filter 21. Furthermore, every time the power amplifier model coefficients $P_{kq}(n)$ are updated, the amplifier model unit 19 outputs the updated power amplifier model coefficients $P_{kq}(n)$ to the inverse unit 20.

The inverse unit 20 includes, for example, a processor, and, every time receiving updated power amplifier model coefficients $P_{kq}(n)$, calculates an inverse function of equation (2), and sets each of coefficients of the polynomial of the inverse function to updated predistortion coefficients A=[$a_{10}$, ..., $a_{k0}$, ..., $a_{1q}$, ..., $a_{KQ}$]$^1$. Note that the operation of calculating the inverse function is disclosed, for example, in Lei Ding et al., "A Robust Digital Baseband Predistorter Constructed Using Memory Polynomials," IEEE Transaction On Communications, Vol. 52, No. 1, January 2004. The inverse unit 20 writes the updated predistortion coefficients in the memory circuit of the predistortion unit 11.

The adaptive low-pass filter 21 is an adaptive-type digital low-pass filter that is designed to have input-output characteristics that match the input-output characteristics of the low-pass filter 17, and generates a pseudo feedback signal by attenuating the high frequency components of the learning digital signal.

Figure 2:
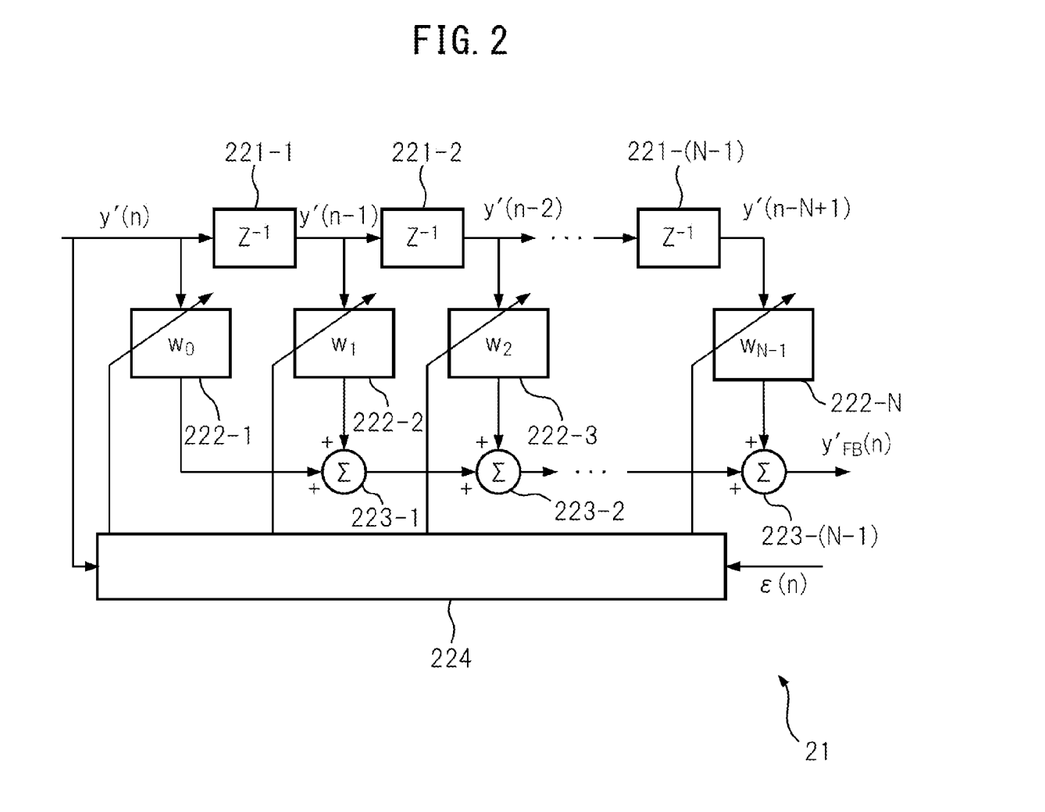
FIG. 2 is an equivalent circuit diagram of an adaptive low-pass filter.

FIG. 2 is an equivalent circuit diagram of an adaptive low-pass filter 21. As illustrated in FIG. 2, the adaptive low-pass filter 21 is a finite impulse response-type filter, and includes (N−1) delay circuits 221-1 to 221-(N−1), N multipliers 222-1 to 222-N, (N−1) adders 223-1 to 223-(N−1), and a learning circuit 224 having a memory.

The input learning digital signal y'(n) is sent to the multiplier 222-1, the delay circuit 221-1 and the learning circuit 224. Then, by the multiplier 222-1, the learning digital signal y'(n) is multiplied by an adaptive weighting coefficient w(0). On the other hand, the learning digital signal y'(n−1) that is delayed by the delay circuit 221-1 is sent to the delay circuit 221-2 and the multiplier 222-2. Then, by the multiplier 222-2, the delayed learning digital signal y'(n−1) is multiplied by an adaptive weighting coefficient w(1). The adder 223-1 adds signal that is output from multiplier 222-2 to the signal that is output from the multiplier 222-1. Then, the acquired sum signal is output to the adder 223-2. Afterward, the same process is repeated. Finally, the pseudo feedback signal to be output from the adder 223-(N−1) is represented by the following equation:

$$y_{FB}'(n) = \Sigma_{k=0}^{N} w(k) \cdot y'(n-k) \quad (4)$$

where $y_{FB}'(n)$ is the pseudo feedback signal at discrete time n. Furthermore, w(k) (k=0, 1, ..., N−1) are the adaptive weighting coefficients. Then, N is the number of filter taps.

Furthermore, the learning circuit 224 of the adaptive low-pass filter 21 updates the adaptive weighting coefficients w(k) based on the error signal ϵ(n) acquired from the subtractor 22. As described above, the error signal ϵ(n) represents the difference between the pseudo feedback signal that is acquired by inputting the learning digital signal to the adaptive low-pass filter 21, and the digitized feedback signal whose the high frequency components are attenuated by the low-pass filter 17.

In the present embodiment, the adaptive low-pass filter 21 updates the adaptive weighting coefficients w(k) from time to time such that the square sum of the error signal ϵ(n) is minimized, by the following equation in accordance with an algorithm of the least mean square method:

$$w_n(k) = w_{n-1}(k) + \beta \cdot \epsilon(n) \cdot y'(n-k) \quad (5)$$

where β is the step size parameter, and determines the update rate of the adaptive weighting coefficients w(k). Note that β is preferably smaller than the step size parameter α in equation (3) for updating the power amplifier model coefficients $P_{kq}$(n). In other words, the update rate of the power amplifier model coefficients and the predistortion coefficients is preferably faster than the update rate of the adaptive weighting coefficients. By this means, the power amplifier model coefficients $P_{kq}$(n) are adjusted such that the error signal ϵ(n) is reduced significantly, after that, the adaptive weighting coefficients w(k) are updated such that the remaining error signal ϵ(n) is cancelled.

The adaptive weighting coefficients w(k) are stored in the memory of the learning circuit 224, and, every time a learning digital signal is input, each of the adaptive weighting coefficients is output from the memory to each multiplier. Further, the pseudo feedback signal that is output from the adaptive low-pass filter 21 is input to the subtractor 22.

The subtractor 22 calculates the error signal ϵ(n){=$y_{FB}'$(n)−$y_{FB}$(n)} by subtracting the feedback signal $y_{FB}$(n) digitized by the analog-to-digital converter 18, from the pseudo feedback signal $y_{FB}'$(n). Then, the error signal ϵ(n) calculated by the subtractor 22 is sent to the amplifier model unit 19 and the adaptive low-pass filter 21.

Figure 3:
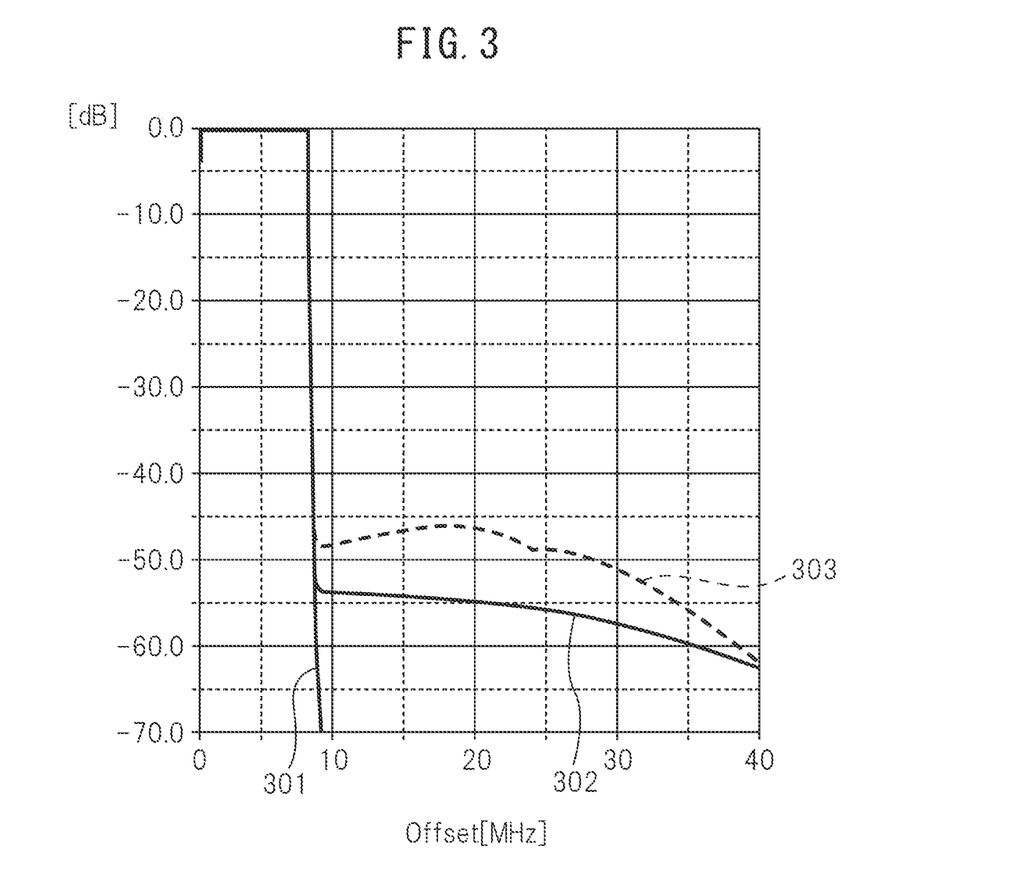
FIG. 3 is a diagram illustrating change of frequency characteristics of a predistortion unit due to difference between the input-output characteristics of an adaptive low-pass filter and the input-output characteristics of a low-pass filter.

FIG. 3 is a diagram illustrating change of the frequency characteristics of the predistortion unit 11 due to the differences between the input-output characteristics of the adaptive low-pass filter 21 and the input-output characteristics of the low-pass filter 17. In FIG. 3, the horizontal axis represents the offset frequency, and the vertical axis represents decibels. The graph 301 illustrates the frequency characteristics of an orthogonal frequency-division multiplexing (OFDM) signal of a 20 MHz bandwidth, which is an example of a transmission signal. The graph 302 represents a simulation result of the frequency characteristics of the predistortion unit 11 when the input-output characteristics of the adaptive low-pass filter 21 completely matches to the input-output characteristics of the low-pass filter 17. Furthermore, the graph 303 represents a simulation result of the frequency characteristics of the predistortion unit 11 when the cut-off frequency of the adaptive low-pass filter 21 is shifted 10% from the cut-off frequency of the low-pass filter 17. As illustrated in the graphs 302 and 303, as the degree of match between the input-output characteristics of the adaptive low-pass filter 21 and the input-output characteristics of the low-pass filter 17 improves, the signal components of out-of-band frequency bands become smaller, and the frequency characteristics of the predistortion unit 11 improve.

Figure 4:
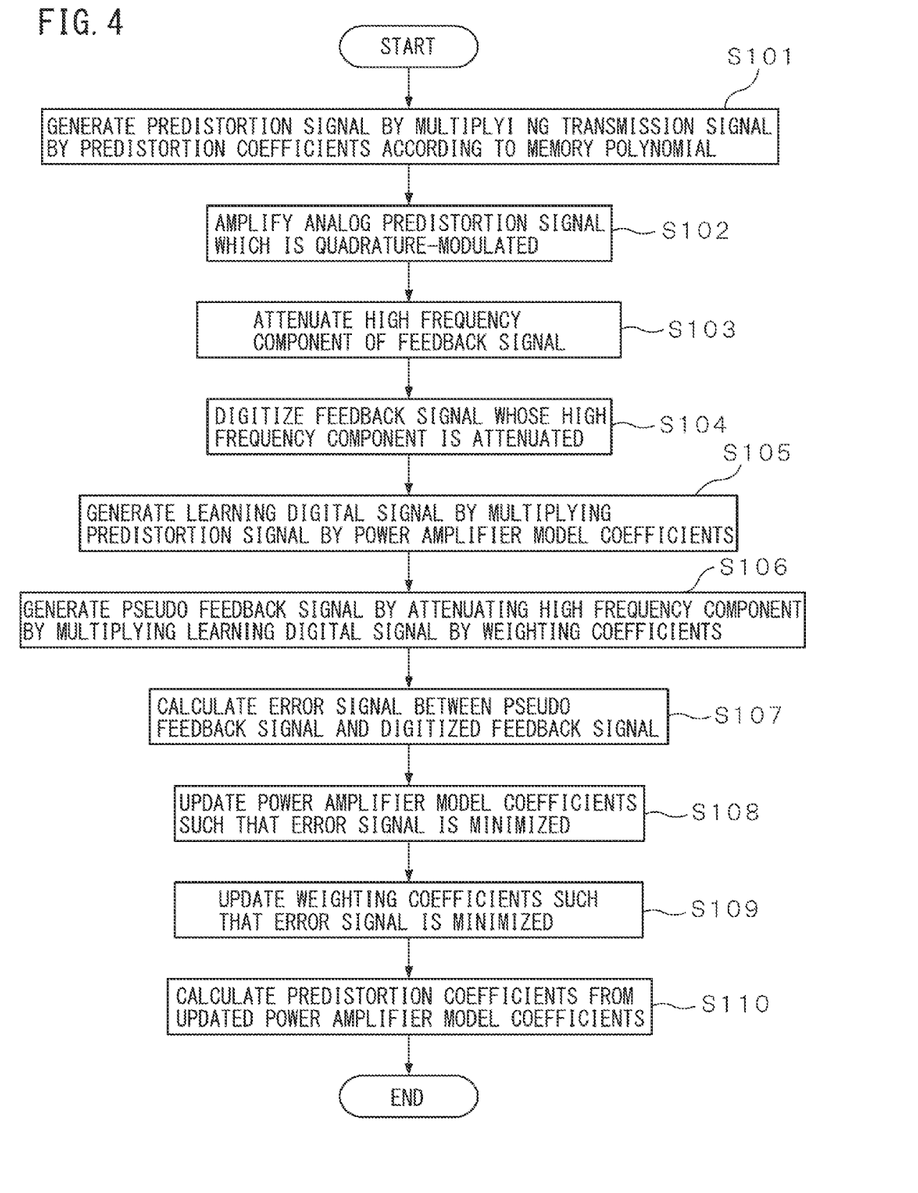
FIG. 4 is an operation flowchart of a predistortion coefficient updating method.

FIG. 4 is an operation flowchart of a predistortion coefficient updating method that is executed by the transmission signal power control apparatus 1.

The predistortion unit 11 generates a predistortion signal by multiplying a transmission signal by predistortion coefficients according to a memory polynomial (step S101). The power amplifier 14 amplifies the signal acquired by converting the predistortion signal to an analog signal and performing quadrature modulation (step S102). Then, the low-pass filter 17 attenuates the high frequency components of the feedback signal that is output from the power amplifier 14 (step S103). The analog-to-digital converter 18 digitizes the feedback signal whose the high frequency components are attenuated (step S104).

The amplifier model unit 19 generates a learning digital signal by multiplying the predistortion signal by power amplifier model coefficients, which tentatively represent the input-output characteristics of the power amplifier 14 (step S105). Then, the adaptive low-pass filter 21 generates a pseudo feedback signal by attenuating the high frequency components of the learning digital signal by multiplying the learning digital signal by adaptive weighting coefficients (step S106). Then, the subtractor 22 calculates an error signal between the pseudo feedback signal and the digitized feedback signal, and outputs the error signal to the amplifier model unit 19 and the adaptive low-pass filter 21 (step S107).

The amplifier model unit 19 updates the power amplifier model coefficients such that the error signal is minimized (step S108). Further, the adaptive low-pass filter 21 updates the adaptive weighting coefficients such that the error signal is minimized (step S109). Then, the inverse unit 20 calculates the predistortion coefficients from the updated model coefficients, and, by the calculated predistortion coefficients, updates the predistortion coefficients stored in the memory circuit of the predistortion unit (step S110).

The transmission signal power control apparatus 1 performs the processes of the steps S101 to S110, every time a transmission signal is input.

As described above, the transmission signal power control apparatus generates a learning digital signal for learning predistortion coefficients, by correcting part of a predistortion signal according to the input-output characteristics of a power amplifier that are reproduced tentatively. Then, the transmission signal power control apparatus allows both the learning digital signal and a feedback signal that is fed back from the power amplifier to pass a low-pass filter, and then calculates the error between the signals, and uses the error to learn the predistortion coefficients. Consequently, the transmission signal power control apparatus is able to optimize the predistortion coefficients even by using an analog-to-digital converter which may produce aliasing in feedback of an output signal. Furthermore, the transmission signal power control apparatus uses an adaptive-type digital filter as the low-pass filter to be applied to the learning digital signal, which allows, the transmission signal power control apparatus to substantially match the input-output characteristics of the adaptive low-pass filter to the input-output characteristics of an analog low-pass filter, which has varying input-output characteristics per individual product. Consequently, the transmission signal power control apparatus is able to further minimize the error between the learning digital signal and the feedback signal, and therefore is able to optimize the predistortion coefficients.

Figure 5:
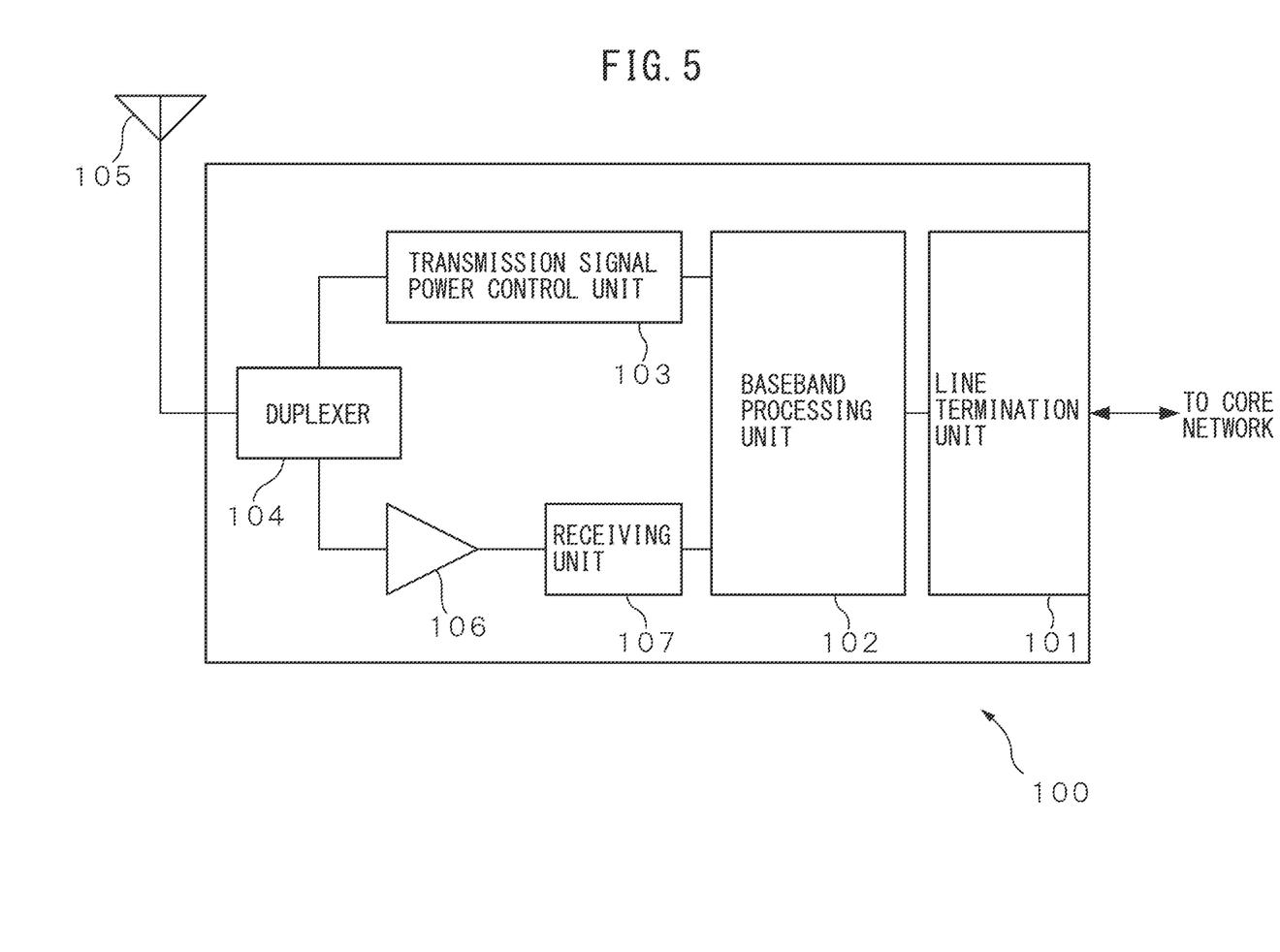
FIG. 5 is a schematic configuration diagram of a base station in which a transmission signal power control apparatus is incorporated.

FIG. 5 is a schematic configuration diagram of a base station, which is an example of a communication apparatus in which a transmission signal power control apparatus according to the above-illustrated embodiment is incorporated. The base station 100 includes a line termination unit 101, a baseband processing unit 102, a transmission signal power control unit 103, a duplexer 104, an antenna 105, a receiving amplifier 106, and a receiving unit 107.

The baseband processing unit 102, the transmission signal power control unit 103 and the receiving unit 107 may be each a separate circuit, or the units may be an integrated circuit.

The line termination unit 101 includes a communication interface for connecting the base station 100 to the core network. Then, the line termination unit 101 receives a downlink signal to be transmitted to a mobile station, from the core network, and outputs the downlink signal to the baseband processing unit 102. Meanwhile, the line termination unit 101 receives an uplink signal received from the mobile station, from the baseband processing unit 102, and outputs the uplink signal to the core network.

The baseband processing unit 102 executes transmission processes such as an error correction coding process, which is, for example, convolutional coding or Turbo coding, for the downlink signal. In addition, the baseband processing unit 102 performs a quadrature modulation process such as orthogonal division frequency multiplexing (OFDMA), for the encoded downlink signal, and multiplexes the downlink signal. The baseband processing unit 102 outputs the quadrature-modulated downlink signal to the transmission signal power control unit 103.

Furthermore, the baseband processing unit 102 demodulates the uplink signal having a baseband frequency, received from the receiving unit 107. Then, the baseband processing unit 102 executes receiving processes such as an error correction decoding process, for the demodulated uplink signal. Then, the baseband processing unit 102 outputs the decoded uplink signal to the line termination unit 101.

The transmission signal power control unit 103 is a transmission signal power control apparatus according to the above embodiment. The transmission signal power control unit 103 performs a predistortion process for the downlink signal, after that, converts the downlink signal to an analog signal. Then, the transmission signal power control unit 103 superimposes the analog downlink signal on a carrier wave having a radio frequency. Then, the transmission signal power control unit 103 amplifies the downlink signal that is superimposed on the carrier wave, by the power amplifier, and transmits the signal to the antenna 105 via the duplexer 104. Then, the antenna 105 emits the downlink signal transmitted from the transmission signal power control unit 103.

The antenna 105 receives the uplink signal that is transmitted from the mobile station, and transmits the uplink signal to the receiving amplifier 106 via the duplexer 104. The receiving amplifier 106 includes a low-noise amplifier. Then, the receiving amplifier 106 amplifies the received uplink signal, and outputs the amplified uplink signal to the receiving unit 107.

The receiving unit 107 converts the frequency of the uplink signal from a radio frequency to a baseband frequency, by superimposing a periodic signal having a local oscillation frequency on the uplink signal. Then, the receiving unit 107 digitizes the uplink signal having a baseband frequency, and passes the result to the baseband processing unit 102.

Figure 6:
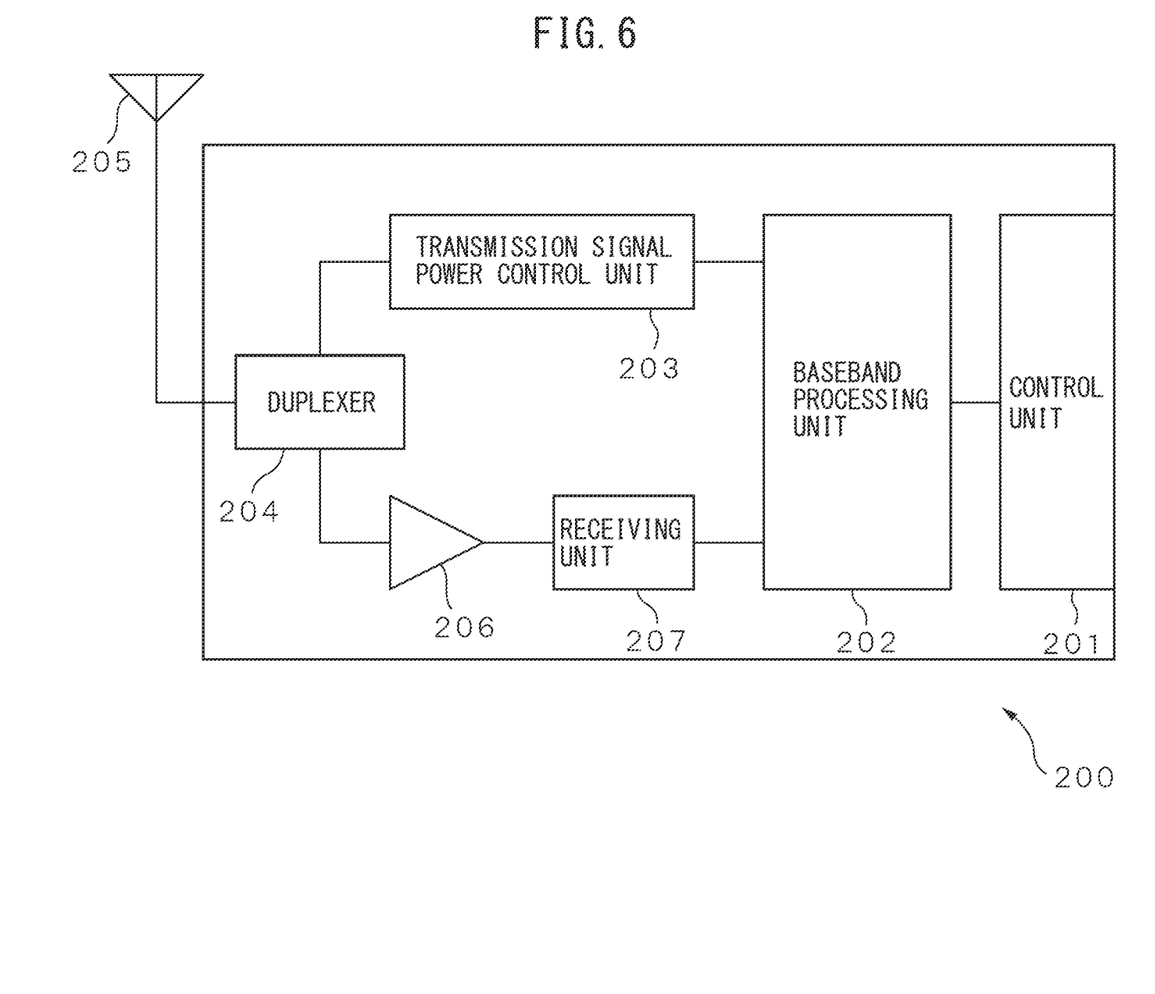
FIG. 6 is a schematic configuration diagram of a mobile station in which a transmission signal power control apparatus is incorporated.

FIG. 6 is a schematic configuration diagram of a mobile station, which is another example of a communication apparatus in which a transmission signal power control apparatus according to the above-described embodiment is incorporated. The mobile station 200 includes a control unit 201, a baseband processing unit 202, a transmission signal power control unit 203, a duplexer 204, an antenna 205, a receiving amplifier 206 and a receiving unit 207. The control unit 201, the baseband processing unit 202, the transmission signal power control unit 203 and the receiving unit 207 may be a separate circuit, respectively, or the units may be an integrated circuit.

The control unit 201 controls the whole of the mobile station 200. Then, the control unit 201 executes various application programs that operate on the mobile station 200. Consequently, the control unit 201 includes a processor, a non-volatile memory and a volatile memory. When an application to allow communication by the telephone or data communication is activated by user operations via an operation unit (not illustrated) included in the mobile station 200 such as a keypad, the control unit 201 executes call control according to the application. Then, the control unit 201 executes an information source encoding process for the data which is requested to be transmitted by the application, or for an audio signal which is acquired from a microphone (not illustrated) included in the mobile station 200. Then, control unit 201 passes the signal acquired as a result of the processes, to the baseband processing unit 202, as an uplink signal. Furthermore, when receiving a downlink signal from the baseband processing unit 202, the control unit 201 acquires the audio signal or data by executing an information source decoding process and so on. Then, the control unit 201 passes the audio signal to a speaker (not illustrated) included in the mobile station 200. Furthermore, the control unit 201 displays the acquired data on a display (not illustrated) included in the mobile station 200.

The baseband processing unit 202 executes transmission processes such as an error correction coding process, which is, for example, convolutional coding or Turbo coding, for the uplink signal. In addition, the baseband processing unit 202 performs a quadrature modulation process for the encoded uplink signal, and multiplexes the uplink signal. The baseband processing unit 202 outputs the quadrature-modulated uplink signal to the transmission signal power control unit 203.

Furthermore, the baseband processing unit 202 demodulates a downlink signal having a baseband frequency, received from the receiving unit 207. Then, the baseband processing unit 202 executes receiving processes such as an error correction decoding process, for the demodulated downlink signal. Then, the baseband processing unit 202 outputs the decoded downlink signal to the control unit 201.

The transmission signal power control unit 203 is a transmission signal power control apparatus according to the above embodiment. The transmission signal power control unit 203 performs a predistortion process for the uplink signal, after that, converts the uplink signal to an analog signal. Then, the transmission signal power control unit 203 superimposes the analog uplink signal on a carrier wave having a radio frequency. Then, the transmission signal power control unit 203 amplifies the uplink signal superimposed on the carrier wave, to the antenna 205, via the duplexer 204. Then, the antenna 205 emits the uplink signal that is transmitted from the transmission signal power control unit 203.

The antenna 205 receives a downlink signal transmitted from the base station, and transmits the downlink signal to the receiving amplifier 206 via the duplexer 204.

The receiving amplifier 206 includes a low-noise amplifier. Then, the receiving amplifier 206 amplifies the received downlink signal, and outputs the amplified downlink signal to the receiving unit 207.

The receiving unit 207 converts the frequency of the downlink signal from a radio frequency to a baseband frequency, by superimposing a periodic signal having a local oscillation frequency on the downlink signal. Then, the receiving unit 207 digitizes the downlink signal having a baseband frequency, and passes the result to the baseband processing unit 202.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alternations could be made hereto without departing from the spirit and scope of the invention.

What is claimed is:

1. A transmission signal power control apparatus comprising:
   a power amplifier which amplifies a transmission signal;
   a first low-pass filter which attenuates a frequency component of a feedback signal, which is higher than a certain sampling frequency, the feedback signal being part of a signal that is output from the power amplifier;
   an analog-to-digital converter which digitizes the feedback signal output from the first low-pass filter by the certain sampling frequency;
   a predistortion unit which generates a predistortion signal to input to the power amplifier, by multiplying the transmission signal by predistortion coefficients which represent an inverse characteristic of an input-output characteristic of the power amplifier;
   a power amplifier model unit which generates a learning digital signal by multiplying part of the predistortion signal by model coefficients which tentatively represent the input-output characteristic of the power amplifier;
   an inverse unit which calculates the predistortion coefficients from the model coefficients;
   a second low-pass filter which generates a pseudo feedback signal by attenuating a high frequency component of the learning digital signal by multiplying the learning digital signal by weighting coefficients; and
   a subtractor which calculates an error between the pseudo feedback signal and the digitized feedback signal,
   wherein
   the power amplifier model unit updates the model coefficients such that the error is minimized, and
   the second low-pass filter is an adaptive filter which updates the weighting coefficients such that the error is minimized.

2. The transmission signal power control apparatus according to claim 1, wherein an update rate of the model coefficients by the power amplifier model unit is faster than an update rate of the weighting coefficients by the second low-pass filter.

3. The transmission signal power control apparatus according to claim 1, wherein the second low-pass filter is a finite impulse response-type adaptive filter.

4. A communication apparatus comprising:
   a baseband processing unit which generates a transmission signal;
   a transmission signal power control unit which amplifies the transmission signal; and
   an antenna which emits the amplified transmission signal,
   wherein the transmission signal power control unit comprises:
   a power amplifier which amplifies the transmission signal;
   a first low-pass filter which attenuates a frequency component of a feedback signal, which is higher than a certain sampling frequency, the feedback signal being part of a signal that is output from the power amplifier;
   an analog-to-digital converter which digitizes the feedback signal output from the first low-pass filter by the certain sampling frequency;
   a predistortion unit which generates a predistortion signal to input to the power amplifier, by multiplying the transmission signal by predistortion coefficients which represent an inverse characteristic of an input-output characteristic of the power amplifier;
   a power amplifier model unit which generates a learning digital signal by multiplying part of the predistortion signal by model coefficients which tentatively represent the input-output characteristic of the power amplifier;
   an inverse unit which calculates the predistortion coefficients from the model coefficients;
   a second low-pass filter which generates a pseudo feedback signal by attenuating the high frequency component of the learning digital signal by multiplying the learning digital signal by weighting coefficients; and
   a subtractor which calculates an error between the pseudo feedback signal and the digitized feedback signal,
   wherein
   the power amplifier model unit updates the model coefficients such that the error is minimized, and
   the second low-pass filter is an adaptive filter which updates the weighting coefficients such that the error is minimized.

5. The communication apparatus according to claim 4, wherein
   the communication apparatus is a base station,
   the communication apparatus further comprises a line termination unit which receives a downlink signal from a core network, and
   the baseband processing unit generates the transmission signal by encoding the downlink signal.

6. The communication apparatus according to claim 4, wherein an update rate of the model coefficients by the power amplifier model unit is faster than an update rate of the weighting coefficients by the second low-pass filter.

7. The communication apparatus according to claim 4, wherein the second low-pass filter is a finite impulse response-type adaptive filter.

8. A predistortion coefficient updating method for updating predistortion coefficients which represent an inverse characteristic of an input-output characteristic of a power amplifier, the predistortion coefficient updating method comprising:

attenuating a frequency component of a feedback signal, which is higher than a certain sampling frequency, the feedback signal being part of a signal that is output from the power amplifier by a first low-pass filter;

digitizing the feedback signal whose the high frequency component is attenuated by the certain sampling frequency;

generating a predistortion signal by multiplying a transmission signal by the predistortion coefficients;

generating a learning digital signal by multiplying the predistortion signal by model coefficients which tentatively represent the input-output characteristic of the power amplifier;

generating a pseudo feedback signal by attenuating a high frequency component of the learning digital signal by multiplying the learning digital signal by weighting coefficients of an adaptive low-pass filter;

calculating an error between the pseudo feedback signal and the digitized feedback signal;

updating the model coefficients such that the error is minimized;

updating the weighting coefficients such that the error is minimized; and calculating the predistortion coefficients from the updated model coefficients.

\* \* \* \* \*